United States Patent
Yoshino

(10) Patent No.: US 10,249,713 B2
(45) Date of Patent: Apr. 2, 2019

(54) SEMICONDUCTOR DEVICE INCLUDING AN ESD PROTECTION ELEMENT

(71) Applicant: SII Semiconductor Corporation, Chiba-shi, Chiba (JP)

(72) Inventor: Hideo Yoshino, Chiba (JP)

(73) Assignee: ABLIC Inc. (JP)

( * ) Notice: Subject to any disclaimer, the term of this patent is extended or adjusted under 35 U.S.C. 154(b) by 0 days.

(21) Appl. No.: 15/457,366

(22) Filed: Mar. 13, 2017

(65) Prior Publication Data

US 2017/0271321 A1    Sep. 21, 2017

(30) Foreign Application Priority Data

Mar. 18, 2016   (JP) ................. 2016-055583

(51) Int. Cl.
*H01L 29/08*   (2006.01)
*H01L 27/02*   (2006.01)

(52) U.S. Cl.
CPC ........ *H01L 29/0847* (2013.01); *H01L 27/027* (2013.01)

(58) Field of Classification Search
CPC .. H01L 27/0266; H01L 29/0847; H01L 23/60
See application file for complete search history.

(56) References Cited

U.S. PATENT DOCUMENTS

| 7,186,610 | B1 * | 3/2007 | Liu | ............. H01L 27/0266 |
| | | | | 257/E21.619 |
| 2009/0050967 | A1 | 2/2009 | Takasu | ............. 257/355 |
| 2013/0341716 | A1 | 12/2013 | Sakamoto | |

OTHER PUBLICATIONS

Abstract, Publication No. JP 2011-124285, Publication date Jun. 23, 2011.

* cited by examiner

*Primary Examiner* — Ratisha Mehta
(74) *Attorney, Agent, or Firm* — Adams & Wilks

(57) ABSTRACT

A semiconductor device includes a MOS transistor and an ESD protection element comprised of an NMOS off transistor having a gate potential equal to a ground potential or a well potential. The off transistor has an N-type drain region and a P-type drain region in a drain active region thereof. The P-type region has a potential that is the potential of a P well or a P-type semiconductor substrate. A junction withstand voltage of a PN junction in the drain active region is the withstand voltage of the ESD protection element.

3 Claims, 5 Drawing Sheets

SEMICONDUCTOR DEVICE INCLUDING AN ESD PROTECTION ELEMENT

BACKGROUND OF THE INVENTION

1. Field of the Invention

The present invention relates to a semiconductor device including an ESD protection element. In particular, the present invention relates to an ESD protection element of an off transistor type provided between an external connection terminal and an internal circuit region, for protecting an internal element configured to operate at low voltage in the internal circuit region from destruction caused by ESD.

2. Description of the Related Art

In semiconductor devices, which are also called ICs, the following phenomenon is known in which discharge current flows in a device due to electrostatic discharge (hereinafter referred to as "ESD"), resulting in destruction of the device caused by the onset of local heat generation or an electric field concentrates. Then, in order to prevent destruction caused by ESD, an ESD protection element is generally provided between an external connection pad and an internal circuit region.

It is known that an N-type MOS transistor (hereinafter abbreviated as "NMOS") in a so-called off state, in which potential of the gate electrode is fixed to a ground potential, is used as the above-mentioned protection element for a semiconductor device including MOS transistors. Such an NMOS is referred to as an off transistor.

In the following description, a P-type MOS transistor is described as well. The P-type MOS transistor is abbreviated as "PMOS".

A drain electrode of the above-mentioned off transistor is connected to the external connection PAD while the off transistor is used, and hence the off transistor is required to have a drain withstand voltage that is equal to or higher than the operating voltage of the IC. Meanwhile, the drain withstand voltage is also required to be lower than the withstand voltage of an element used in the internal circuit region, which is typified by a transistor, in order to prevent an ESD surge from reaching the internal circuit region.

Since the drain withstand voltage of the off transistor is determined by a so-called surface breakdown which is an avalanche breakdown that occurs when a depletion layer is not sufficiently extended in a drain region because the gate electrode is off, and by a so-called junction breakdown which is an avalanche breakdown that occurs at a PN junction between the drain region and a well region fixed to the ground potential or an element isolation region, taking those two types of breakdown into consideration the withstand voltage is set to a value that is equal to or higher than the operating voltage of the IC and lower than the withstand voltage of a device used in the internal circuit region.

The starting voltage for the above-mentioned surface breakdown is determined mainly by the thickness of a gate oxide film and the concentration and length of a low-concentration drain extension region. The starting voltage for junction breakdown is determined by the concentration of a high-concentration drain region and the concentrations of a well and an element isolation region.

Here, in low voltage operation ICs configured to operate at 8 V or lower, in order to reduce manufacturing cost, the thickness of a gate insulating film and the concentrations of a drain region and a well are not set individually between a device used in an internal circuit region and an ESD protection element. As a result, although the ESD protection element is supposed to have a lower withstand voltage than the device used in the internal circuit region, it is difficult to achieve such a difference in withstand voltage, with the result that the IC cannot be protected by the ESD protection element.

In view of the above, the following measures are taken in the related art. One of the measures involves increasing the concentration of a channel region through ion implantation into the channel region, for example, such that the channel region has a high concentration, thereby reducing the withstand voltage of the ESD protection element, and another involves devising a circuit configuration (for example, see Japanese Patent Application Laid-open No. 2011-124285).

However, in the case of taking the measure involving implanting ions into the channel region, even when high concentration ion implantation is performed before a gate insulating film is formed, a Si surface is damaged by asking necessary to remove a cured resist. As a result, the life time of the gate insulating film is shortened. On the other hand, even when high concentration ion implantation is performed after the gate insulating film is formed, ions are directly implanted into the gate insulating film, and the lifetime of the gate insulating film is consequently shortened. In addition, a dedicated mask is necessary, leading to an increase in manufacturing cost and TAT, which indicates how long it takes to produce one product.

Further, in the case of taking an ESD protection measure such as the one in Japanese Patent Application Laid-open No. 2011-124285 described above, the circuit scale increases.

SUMMARY OF THE INVENTION

In view of the above, the present invention takes the following measures.

A semiconductor device including a MOS transistor includes, as an ESD protection element, an off transistor that is an NMOS having a gate potential being a ground potential or a well potential. The off transistor has an N-type drain region and a P-type drain region in a drain active region thereof. The P-type region has a potential that is the potential of a P well or a P-type semiconductor substrate. A junction withstand voltage of a PN junction in the drain active region is the withstand voltage of the ESD protection element.

The junction withstand voltage of the PN junction is equal to or higher than an operating voltage of an IC and lower than withstand voltages of all elements in an internal circuit region.

The P-type region in the drain active region has the same concentration as a drain extension region of a PMOS.

The P-type region in the drain active region has the same concentration as a high-concentration drain region of the PMOS.

The P-type region in the drain active region is provided in a W end of the drain active region.

The P-type region in the drain active region is provided in a desired region other than the W end of the drain active region.

The P-type region in the drain active region is provided in the W end of the drain active region and in a desired region.

With the use of the above-mentioned measures, the present invention can provide an ESD protection element having a lower withstand voltage than an internal circuit region, without increasing manufacturing cost and TAT as well as a circuit scale thereof.

DESCRIPTION OF THE EMBODIMENTS

Now, embodiments of the present invention are described with reference to the drawings.

First Embodiment

Figure 1:
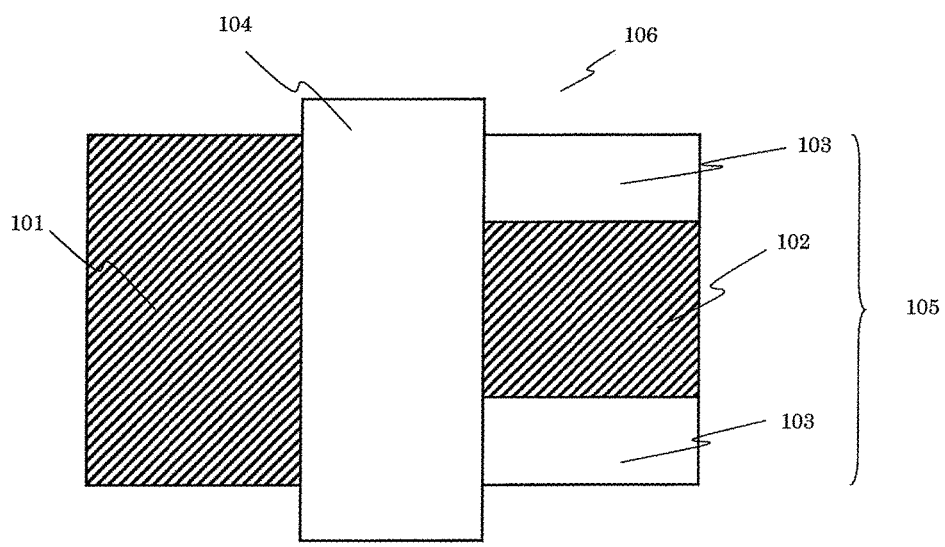
FIG. 1 is a schematic diagram for illustrating an ESD protection element according to a first embodiment of the present invention.

FIG. 1 is a diagram for illustrating an ESD protection element according to a first embodiment of the present invention.

The ESD protection element using an NMOS is illustrated. The ESD protection element has an N-type high-concentration source region 101, an N-type high-concentration drain region 102 connected to an external output terminal, a gate electrode 104, and P-type drain regions 103 adjacent to the respective sides of the N-type high-concentration drain region 102. The N-type high-concentration source region 101 and the N-type high-concentration drain region 102 generally have an impurity concentration of about $10^{22}$ cm$^{-3}$. Further, the above-mentioned NMOS is formed in a P well having an impurity concentration of from about $10^{15}$ cm$^{-3}$ to about $10^{17}$ cm$^{-3}$, or in a P-type semiconductor substrate 106, and has a gate insulating film having a thickness of from about 5 nm to about 30 nm. Here, the gate electrode 104 has the same potential as the P well or the P-type semiconductor substrate 106. Thus, the ESD protection element is a so-called off transistor. Further, the P-type drain regions 103 are also in contact with the P well or the P-type semiconductor substrate 106, and have the same potential as the P well or the P-type semiconductor substrate 106.

Here, first, how the ESD protection element operates when an ESD surge of positive polarity enters a semiconductor device from the outside thereof is described.

When the positive surge enters the semiconductor device from an external connection terminal, the potential of the N-type high-concentration drain region 102 of the ESD protection element increases. Meanwhile, since the P-type drain regions 103 are connected to the P well or the P-type semiconductor substrate 106 and have the same potential as the P well or the P-type semiconductor substrate 106, avalanche breakdown due to a PN junction thus occurs in the drain region to generate electron and hole pairs. The holes generated here flow to the source side at low potential through the P well or the P-type semiconductor substrate 106. At that time, voltage rise occurs due to the current that accordingly flows and the resistance of the P well or the P-type semiconductor substrate 106. When the voltage rise exceeds the potential of the N-type high-concentration source region 101 by a certain amount, electrons are injected from the N-type high-concentration source region 101 to the P well or the P-type semiconductor substrate 106 in the forward direction of the diode, and the electrons reach the N-type high-concentration drain region 102. In this way, current flows between the drain and the source of the NMOS. This operation is so-called parasitic bipolar operation. The semiconductor device can be protected by the ESD protection element through the parasitic bipolar operation in which an ESD surge is caused to flow from the drain region connected to the external connection terminal to a terminal on the source side so that the ESD surge does not reach the internal circuit region.

In order to protect an IC by the above-mentioned operating principle, the impurity concentration of the P-type drain regions 103 is required to be determined such that a junction withstand voltage between the P-type drain regions 103 and the N-type high-concentration drain region 102 takes a desired withstand voltage that is equal to or higher than the operating voltage of the IC and lower than the withstand voltage of an internal element.

For example, an internal element which forms an IC, whose operating voltage is 8 V or lower, has, in case of an NMOS, a withstand voltage that is determined, in many cases, by the junction withstand voltage between an N-type high-concentration region, and a P-type field region formed through ion implantation to the lower part of a field insulating film for element isolation. On the other hand, in case of a PMOS, an internal element has a withstand voltage that is determined, in many cases, by the junction withstand voltage similar to the above or a junction withstand voltage between a P-type high-concentration region and an N well.

Here, a drain of a PMOS of an IC whose operating voltage is 8 V or lower has, in many cases, an LDD structure or a drain extension structure including a drain electric field reducing layer. The impurity concentration of a P-type region that is formed in this drain electric field reducing layer through ion implantation is from about $10^{17}$ cm$^{-3}$ to about $10^{20}$ cm$^{-3}$ in general.

When the P-type drain region 103 is formed by ion implantation for the drain electric field reducing layer of the PMOS, the withstand voltage of the ESD protection element according to the present invention can be set to a value that is equal to or higher than the operating voltage and lower than the withstand voltage of the internal element without the addition of a mask or a step.

In the case of an IC whose operating voltage is 5 V or lower, the P-type drain region 103 may be subjected to ion implantation for P-type high-concentration source and drain regions used in the PMOS. Also in this case, desired characteristics can be obtained without the addition of a mask or a step.

In the first embodiment of the present invention, the P-type drain regions 103 are formed in end portions (W ends) in a W direction, which is the channel width of a drain active region 105, so as to be adjacent to a channel region located under the gate electrode 104, and the N-type high-concentration drain region 102 is formed between the two P-type drain regions 103. Each of the two P-type drain regions 103 extends, along the rim of the drain active region 105 that is parallel to a direction connecting the source region and the drain region, from one rim of the drain active region 105 immediately below the gate electrode 104 to another rim of the drain active region 105 that is opposite to the gate electrode 104. In this case, the P-type drain region 103 is required to have a sufficient P-type region even when an ion implantation mask for the N-type high-concentration drain region 102 is not correctly aligned, or thermal diffusion occurs in the N-type high-concentration drain region 102.

Meanwhile, when the P-type drain region 103 is too large, the balance between the P-type drain region 103 and the N-type high-concentration source region 101 may be lost, or the effective width of the N-type high-concentration drain region 102 may greatly reduce to lower ESD tolerance. Thus the P-type drain region 103 has a width of from 1 µm to 3 µm.

The P-type regions 103 are formed in both of the W ends in the above description, but the P-type drain region 103 may be formed only in one of the W ends.

Second Embodiment

Figure 2:
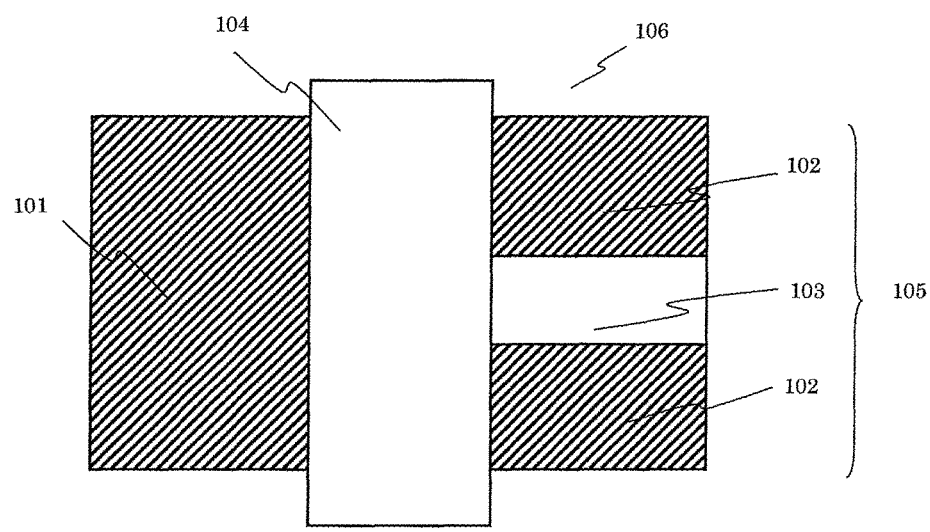
FIG. 2 is a schematic diagram for illustrating an ESD protection element according to a second embodiment of the present invention.

FIG. 2 is a diagram for illustrating an ESD protection element according to a second embodiment of the present invention. The P-type region 103 may be formed in the drain active region 105. In the case of an ESD protection element having a small unit of W, when the two P-type drain regions 103 are provided, the effective N-type high-concentration drain region 102 reduces to lower ESD tolerance. To cope with this, as illustrated in FIG. 2, the P-type drain region 103 is provided between the N-type high-concentration drain regions 102 formed in both of the end portions (both of W ends) in the channel width direction.

Third Embodiment

Figure 3:
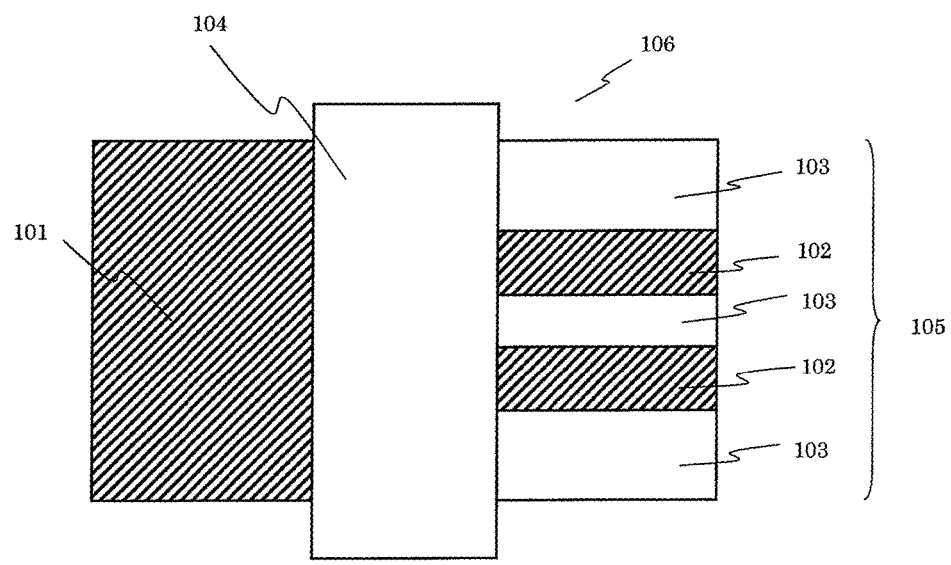
FIG. 3 is a schematic diagram for illustrating an ESD protection element according to a third embodiment of the present invention.

FIG. 3 is a diagram for illustrating an ESD protection element according to a third embodiment of the present invention. The P-type regions 103 may be provided in the middle of the drain active region 105 in addition to both of the W ends. In this case, the two N-type high-concentration drain regions 102 are respectively formed on the inner sides of the two P-type drain regions 103 formed in both of the W ends, and the P-type drain region 103 is provided between the two N-type high-concentration drain regions 102. In the case of an ESD protection element having a large channel width W, when only the two P-type drain regions 103 are provided in the W ends, parasitic bipolar operation which starts from the W ends rarely occurs, with the result that desired characteristics may not be obtained. Thus, the arrangement of FIG. 3 may also be employed.

Fourth Embodiment

Figure 4:
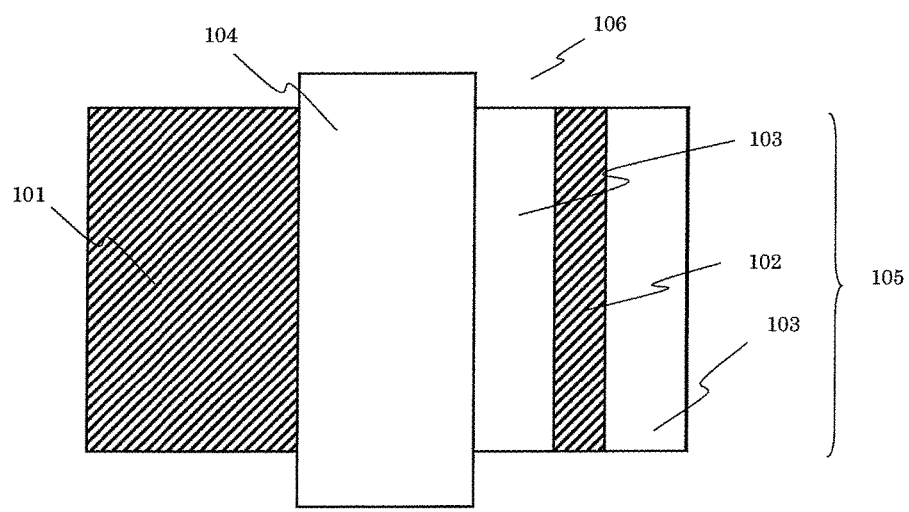
FIG. 4 is a schematic diagram for illustrating an ESD protection element according to a fourth embodiment of the present invention.

FIG. 4 is a diagram for illustrating an ESD protection element according to a fourth embodiment of the present invention. The P-type regions 103 are formed in an L direction of the drain active region 105. That is, the drain active region 105 is divided into three, and in order from the gate electrode 104, the P-type drain region 103, the N-type high-concentration drain region 102, and the P-type drain region 103 are formed parallel to the channel width direction. With this arrangement, the drain active region 105 is increased in size. However, the PN junction in the drain region is in the same direction as the N-type high-concentration source region 101, and the junction surface is large. As a result, stable parasitic bipolar operation can be expected.

Fifth Embodiment

Figure 5:
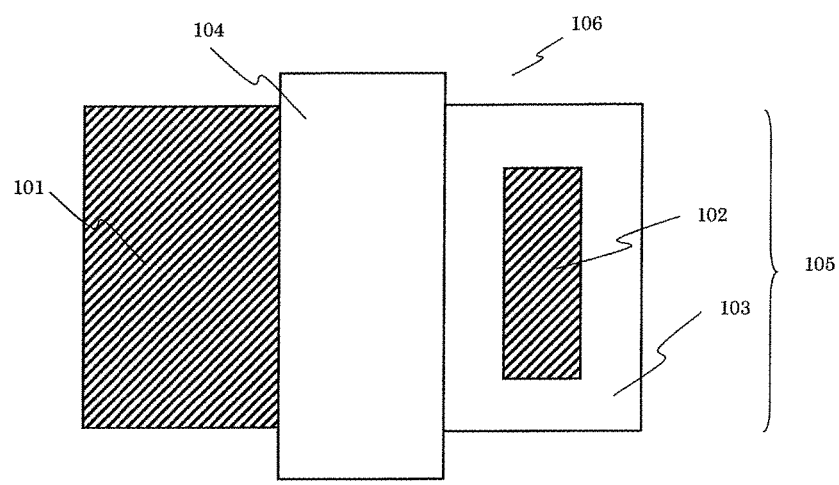
FIG. 5 is a schematic diagram for illustrating an ESD protection element according to a fifth embodiment of the present invention.

FIG. 5 is a diagram for illustrating an ESD protection element according to a fifth embodiment of the present invention. In the drain active region 105, the P-type drain region 103 surrounds the N-type high-concentration drain region 102. With this arrangement, the junction surface of the PN junction in the drain region can be larger than that of the fourth embodiment, and hence parasitic bipolar operation more stable than that of the fourth embodiment can be expected.

What is claimed is:

1. A semiconductor device including an ESD protection element,
the semiconductor device comprising an element in an internal circuit region and having an operating voltage,
the ESD protection element comprising an N-type MOS transistor provided on one of a P well and a P-type semiconductor substrate,
the N-type MOS transistor including a gate electrode connected to one of the P well and the P-type semiconductor substrate such that the gate electrode has one of a well potential that is a potential of the P well and a ground potential that is a potential of the P-type semiconductor substrate,
the N-type MOS transistor having a drain active region in which an N-type high-concentration drain region and a P-type drain region are adjacent to each other to form a PN junction,
the P-type drain region having a potential that comprises one of the potential of the P well and the potential of the P-type semiconductor substrate,
the P-type drain region being adjacent to an end portion of the drain active region in a W direction, and another P-type drain region being provided in a region away from the end portion in the W direction, and
the ESD protection element having a withstand voltage that comprises a junction withstand voltage of the PN junction in the drain active region.

2. A semiconductor device including an ESD protection element,
the semiconductor device comprising an element in an internal circuit region and having an operating voltage,
the ESD protection element comprising an N-type MOS transistor provided on one of a P well and a P-type semiconductor substrate,
the N-type MOS transistor including a gate electrode connected to one of the P well and the P-type semiconductor substrate such that the gate electrode has one of a well potential that is a potential of the P well and a ground potential that is a potential of the P-type semiconductor substrate,
the N-type MOS transistor having a drain active region in which an N-type high-concentration drain region and a P-type drain region are adjacent to each other to form a PN junction,
the P-type drain region having a potential that comprises one of the potential of the P well and the potential of the P-type semiconductor substrate,
the P-type drain region being adjacent to each of two end portions of the drain active region in a W direction, along a rim of the gate electrode, and
the ESD protection element having a withstand voltage that comprises a junction withstand voltage of the PN junction in the drain active region.

3. A semiconductor device including an ESD protection element,
the semiconductor device comprising an element in an internal circuit region and having an operating voltage,
the ESD protection element comprising an N-type MOS transistor provided on one of a P well and a P-type semiconductor substrate,
the N-type MOS transistor including a gate electrode connected to one of the P well and the P-type semiconductor substrate such that the gate electrode has one of a well potential that is a potential of the P well and a ground potential that is a potential of the P-type semiconductor substrate, the N-type MOS transistor having a drain active region in which an N-type high-concentration drain region and a P-type drain region are adjacent to each other to form a PN junction, the P-type drain region having a potential that comprises one of the potential of the P well and the potential of the P-type semiconductor substrate, the N-type high-concentration drain region being entirely surrounded by the P-type drain region, and the ESD protection element having a withstand voltage that comprises a junction withstand voltage of the PN junction in the drain active region.

* * * * *